(12) United States Patent
Adam et al.

(10) Patent No.: US 7,129,129 B2
(45) Date of Patent: Oct. 31, 2006

(54) VERTICAL DEVICE WITH OPTIMAL TRENCH SHAPE

(75) Inventors: Thomas N. Adam, Poughkeepsie, NY (US); David C. Ahlgren, Wappingers Falls, NY (US); Kangguo Cheng, Beacon, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 10/708,861

(22) Filed: Mar. 29, 2004

(65) Prior Publication Data
US 2005/0212027 A1   Sep. 29, 2005

(51) Int. Cl.
*H01L 21/00* (2006.01)

(52) U.S. Cl. ............... 438/242; 438/244; 438/396; 438/931

(58) Field of Classification Search ........ 438/238–239, 438/242–244, 301, 305, 386, 396; 257/931, 257/68, 301, 305, 905, 77, 328, 327, 329–335
See application file for complete search history.

(56) References Cited

U.S. PATENT DOCUMENTS

| | | | |
|---|---|---|---|
| 4,673,962 A | 6/1987 | Chatterjee et al. | |
| 5,888,864 A | 3/1999 | Koh et al. | |
| 6,432,774 B1 | 8/2002 | Heo et al. | |
| 6,583,462 B1 | 6/2003 | Furukawa et al. | |
| 6,740,555 B1 * | 5/2004 | Tews et al. | 438/242 |
| 6,781,196 B1 * | 8/2004 | So et al. | 257/329 |

* cited by examiner

*Primary Examiner*—Carl Whitehead, Jr.
*Assistant Examiner*—Yennhu B. Huynh
(74) *Attorney, Agent, or Firm*—Eric Petraske; Steve Capella

(57) ABSTRACT

A method of forming a trench in a semiconductor substrate includes a step of converting the cross section of the upper portion of the trench from octagonal to rectangular, so that sensitivity to alignment errors between the trench lithography and the active area lithography is reduced. Applications include a vertical transistor that becomes insensitive to misalignment between the trench and the litho for the active area, in particular a DRAM cell with a vertical transistor.

11 Claims, 6 Drawing Sheets

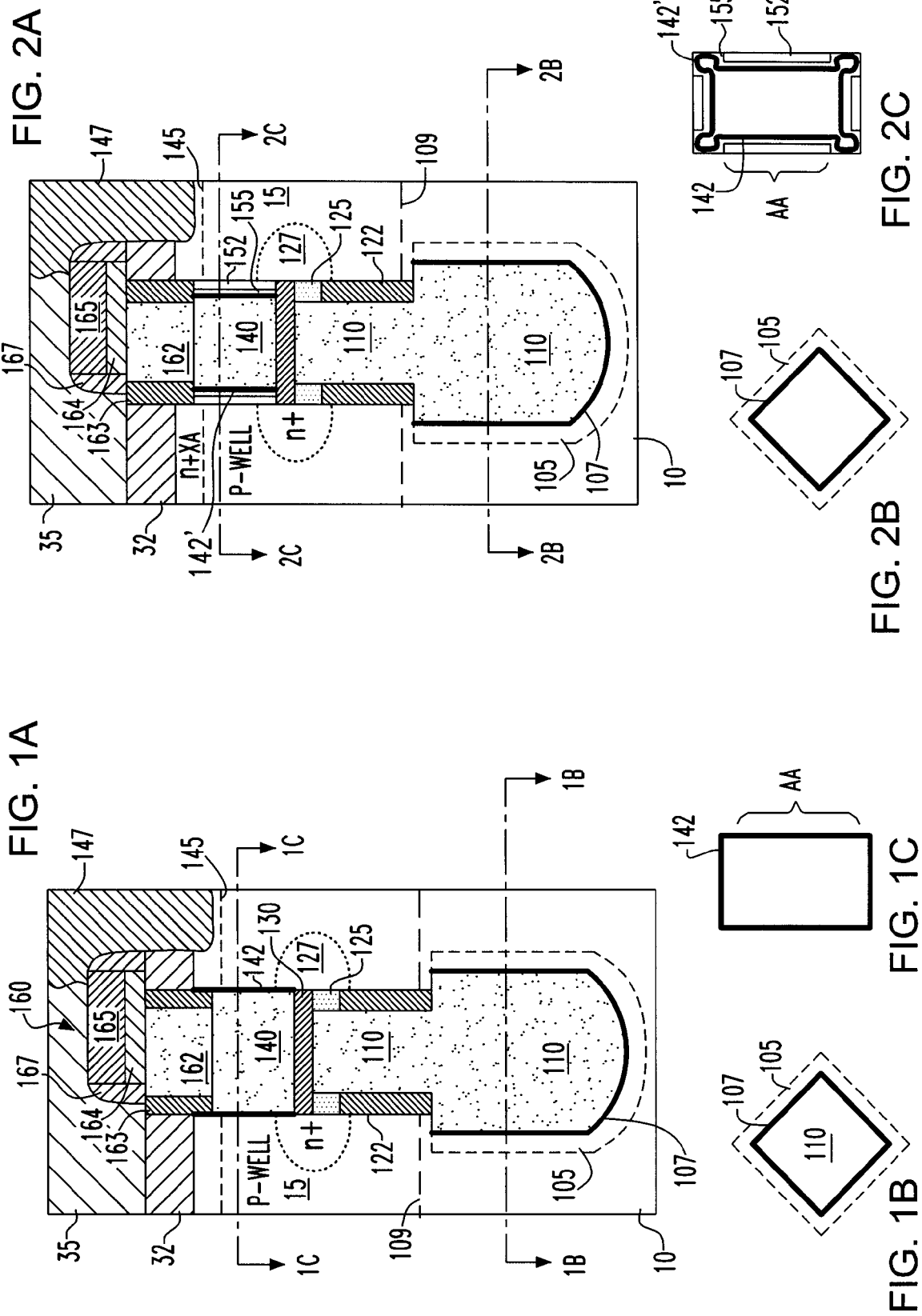

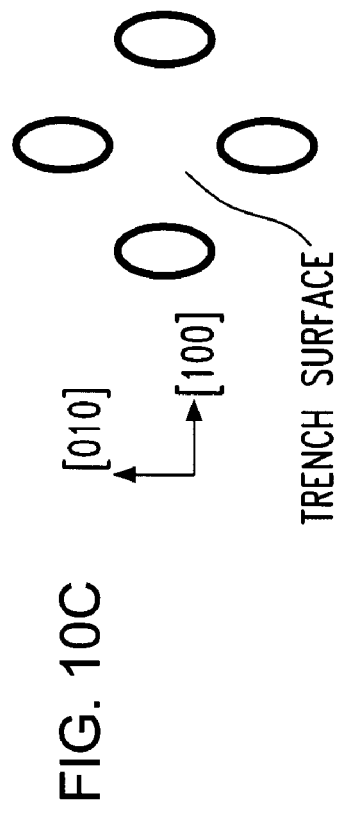
FIG. 10C
[100]
TRENCH SURFACE
FIG. 10B
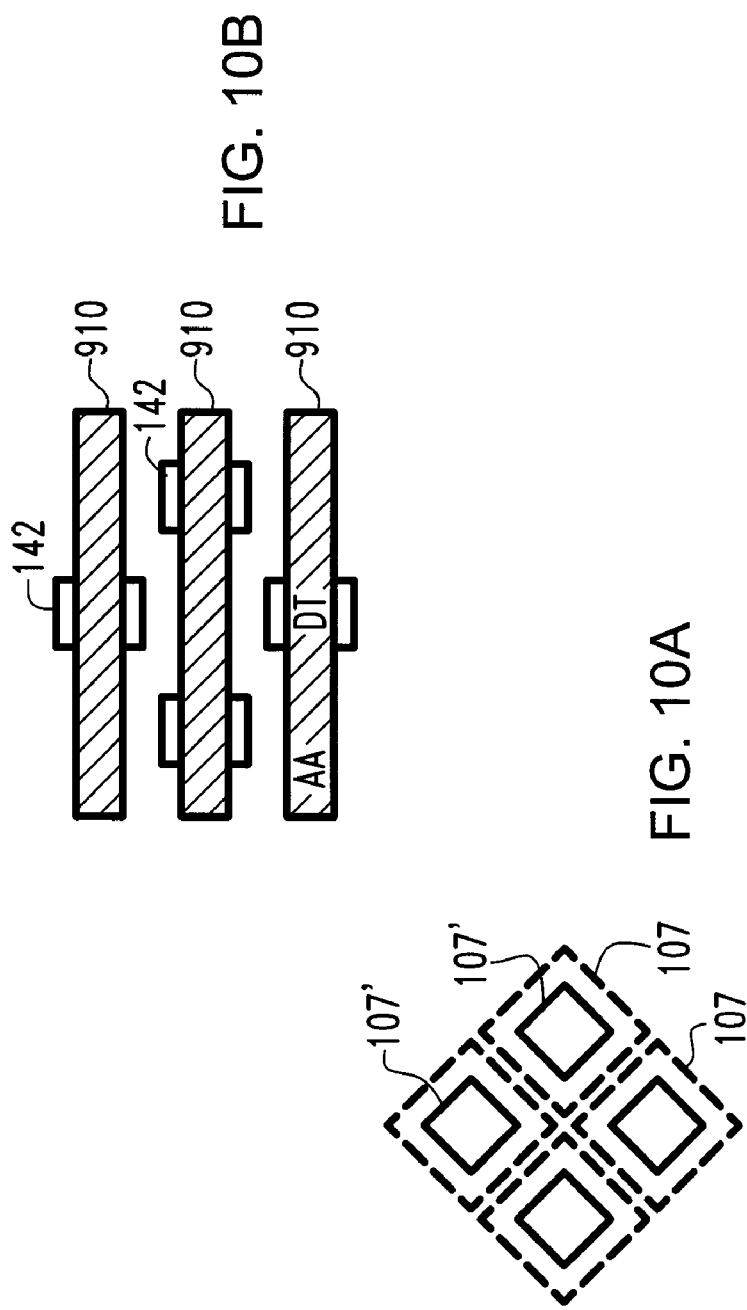
FIG. 10A

US 7,129,129 B2

VERTICAL DEVICE WITH OPTIMAL TRENCH SHAPE

BACKGROUND OF INVENTION

The field of the invention relates to trenches formed in a substrate, and more particularly to trench memory devices having a vertical transistor above a trench capacitor.

FIG. 8B illustrates in simplified form a cross section of a pair of DRAM cells formed in substrate 10 and having a P-well 15. A trench has been etched into the substrate and capacitor 100 has been formed in the lower portion, with dielectric 107 and center electrode 110. In the upper portion of the trench, a vertical transistor 200 has been formed, with buried strap 127 as the lower electrode.

In the course of etching a deep trench in a silicon substrate, a conventional configuration of orienting the trench in the substrate is the <100> configuration, in which the long axis of the oval trenches are printed at the wafer surface are parallel to a <100> crystallographic direction of the substrate (diagramed in FIG. 8A). In this configuration, the formed trench assumes a square shape in the bottom, as shown in FIG. 9A; an oval shape at wafer surface, as shown in FIG. 9C; and an octagon shape in the upper portion of the trench, as shown in FIG. 9B. The change of trench shape at different depth is due to the fact that etch rates are different at different crystallographic orientations. Specifically, the {100} surfaces of the silicon are etched at a greater rate than the {110} surfaces.

The <100> configuration is conventionally chosen because the differential etching along the crystal planes produces a square cross section that packs together tightly, even after the step of bottle etching, so that the capacitance can be maximized by using the bottle etch step, without having an excessive risk of trench merging. However, the octagonal cross section of the upper trench where the vertical transistor is formed matches poorly with the stripe that defines the active area (AA) by defining the isolation structures that separate devices and structures on the wafer surface.

FIG. 9B shows AA strips 910 that meet the octagons 920 that represent the trench cross section such that the corners of the octagons are at the trench-AA intersection. This results in the undesired variation of vertical transistor characteristics such as threshold voltage (Vt) when the trench-AA intersection is located slightly away from the corner or at the corner of the octagon.

Thus, the requirement of getting the highest capacitance in the trench and avoiding shorts between capacitors conflicts with the need for a tight alignment tolerance between the trench and the AA level.

The art could benefit from a trench capacitor—vertical transistor process that preserves tight tolerance between the trench and the active area.

SUMMARY OF INVENTION

The invention relates to a trench that has a square cross section at the bottom portion of the trench and a rectangular cross section at the top portion of the trench.

A feature of the invention is the deposition of silicon germanium layer (SiGe or $Si_{1-x}Ge_x$) on the interior of the trench that forms thicker on the {100} silicon planes than on the {110} planes.

Another feature of the invention is etching the SiGe to leave a protective layer on the {100} surfaces that prevents them from etching as fast as other surfaces.

Another feature of the invention is forming a trench memory device that has a square cross section at the bottom portion of the trench and a rectangular cross section at the top portion of the trench.

BRIEF DESCRIPTION OF DRAWINGS

FIGS. 1A–1C show the final structure of a first embodiment.

FIGS. 2A–2C show the final structure of a second embodiment

FIGS. 10A–10C show cross sections of a cell according to the invention.

DETAILED DESCRIPTION

FIG. 1A shows a cross section of a DRAM cell having a conventional arrangement of a trench capacitor and a vertical transistor, well known to those skilled in the art.

The space saving advantages of the vertical DRAM cell are also well known in the art. It is also well known that as the dimensions of lithography shrink, it becomes more difficult to maintain adequate tolerances between adjacent trench capacitors and between the lithographic pattern of the lower trench capacitor and the pattern for the active area of the upper portion of the cell that contains the transistor.

At the bottom of FIG. 1A, silicon substrate 10 contains a trench capacitor having a buried plate 105 formed by diffusing dopant(s) into the substrate and a center capacitor electrode 110, separated from the buried plate by capacitor dielectric 107. Other capacitor structures such as having textured hemispherical grained silicon or multiplate capacitors (not shown) may also be used.

Figure 8A:
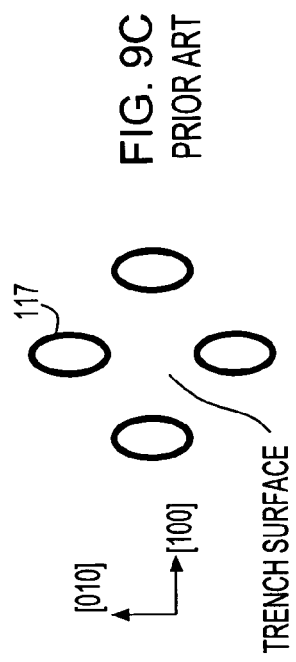
FIG. 8 shows a top view and cross section of a conventional trench memory cell.

FIG. 1B shows a cross section of the capacitor looking down from above through line 1B—1B in FIG. 1A. In this view, the square cross section of the capacitor shows clearly. The trench has the <100> configuration in which the long axis of the oval trench printed at the wafer surface is parallel to an <100> crystallographic direction of the substrate (diagrammed in FIG. 8A). The cross section is shown oriented at 45 degrees with respect to the axis of the drawing. The cause of this orientation is that the silicon substrate is oriented with respect to the lithographic pattern such that the axis of the trench (vertical in the drawing) is parallel to a <100> direction in the {001} substrate. During the etching process, the difference in etch rates between the crystal planes causes the 45 degree orientation of equal length sides.

Figure 8B:
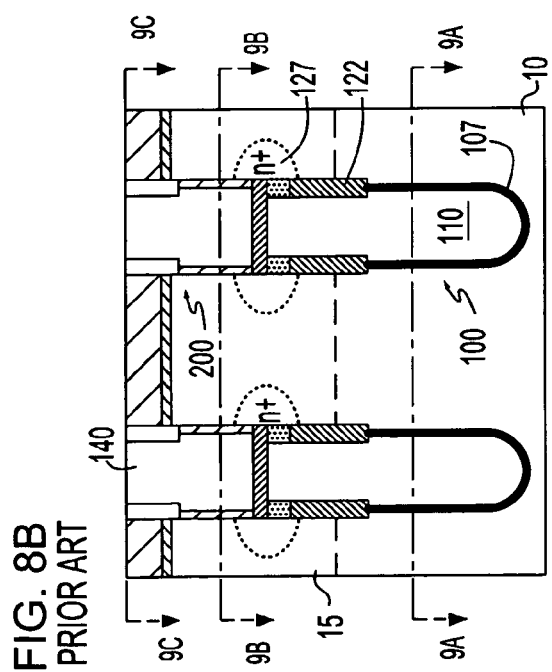

FIG. 8 shows a top view of the substrate, with x and y axes being along the [100] and [010] directions, respectively.

FIG. 9 shows cross sections at the bottom, middle and surface of a prior art DRAM cell.

Figure 9A:
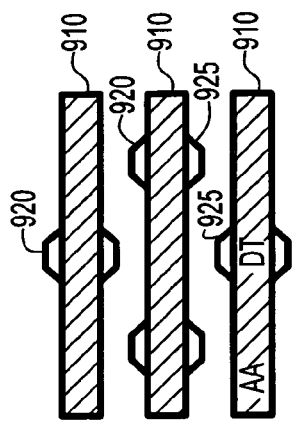
FIGS. 9A–9C show cross sections of the cell of FIG. 8B.

FIG. 9A shows an arrangement of four neighboring cells.

Figure 9B:
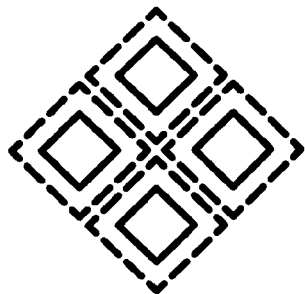

FIG. 9B shows the alignment of the upper portion 920 of the cells, having the conventional octagonal shape of the prior art trenches, and strips 910 of the active area layout. It will be apparent to those skilled in the art that alignment of an octagon with respect to a strip will produce a different threshold voltage Vt in the transistor, depending on the exact alignment or lack of alignment of the corners of the octagon with respect to the strip 910.

Figure 9C:
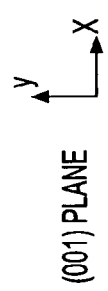

FIG. 9C shows the conventional oval shape of the surface of the cell, at the pad insulator or other non-silicon top surface.

Cells according to the invention have the compact arrangement of the capacitors shown in FIG. 9A and the oval shapes of the surface, as shown in FIG. 9C. The structural difference provided by the present invention is in the shape of the upper portion of the cell that holds the transistor.

Referring back to FIG. 1C, there is shown a cross section looking down from above of a cell formed according to the invention having a rectangular cross section.

FIGS. 10A–10C show cross sections of a cell constructed according to the invention, taken at the same vertical positions in the cell as in FIGS. 9A–9C according to the prior art.

FIG. 10A shows that the construction method according to the invention preserves the advantageous compact arrangement of the capacitors. Dashed line 107 indicates the interior surface of the trench and solid line 107' indicates the interior surface before the bottle etch step. The buried plates of the separate capacitors are not shown.

FIG. 10C shows the same conventional oval shape as shown in FIG. 9C.

FIG. 10B shows that the AA strips, denoted with the same numeral 910 as in FIG. 9B, are aligned with the rectangular cross sections of the upper trench portions 142 (using the same numeral as in FIG. 1C) in a manner that is insensitive to misalignment. Since there is no corner near the intersection of the AA strip and the upper trench, the problem of variation in transistor Vt as a result of slight misalignment does not arise.

Figure 3C:
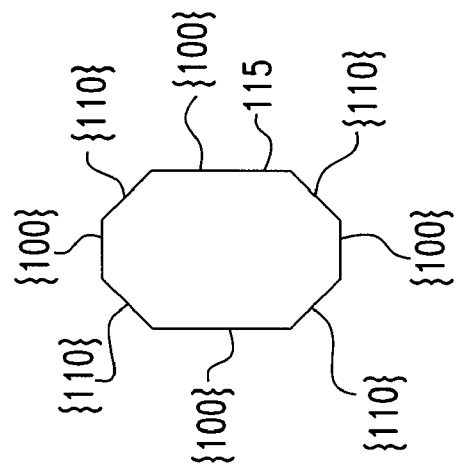
FIG. 3 shows the result of processing the lower portion of a cell.

According to the invention, the preliminary steps of etching the trench down to form the basis for the capacitor are conventional. As shown in FIG. 3D, lithography defines an oval pattern on wafer surface with its axes parallel to the <100> directions of the crystal. A reactive ion etch (RIE) with parameters and chemistry set for directional etching etches into the substrate 10 to an appropriate depth that is about 8 microns in contemporary technology.

Figure 3B:
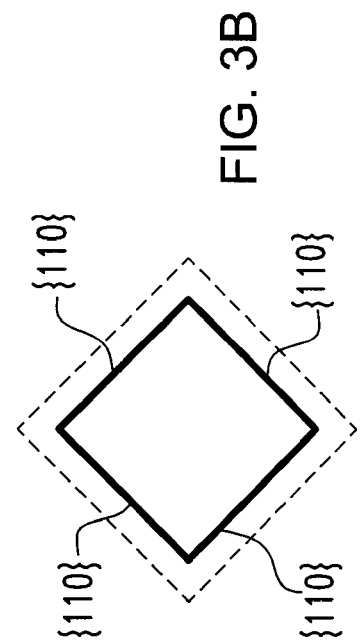
Figure 3D:
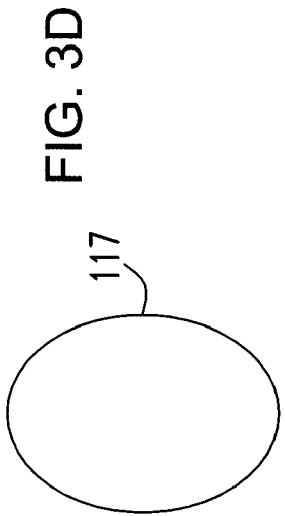

As the trench penetrates the substrate, the {100} surfaces etch at a greater rate than the {110} surfaces, converting the initial orientation to the orientation shown in FIG. 3B, with the sides at 45 degrees to the <100> directions in the lower portion of the trench.

Figure 3A:
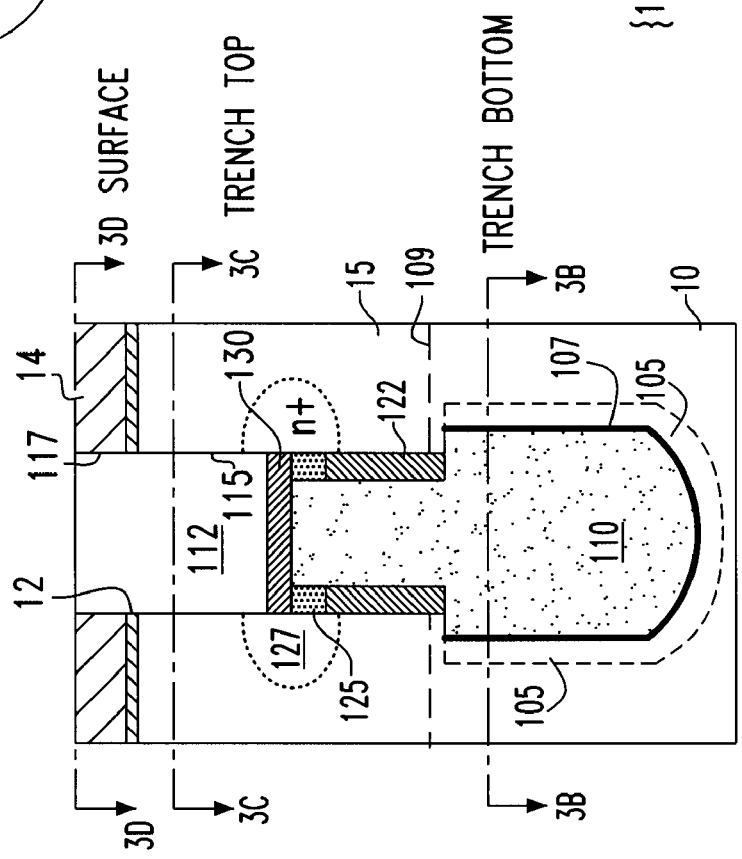

Referring to FIG. 3A, the trench capacitor in the lower portion of the trench is processed in a conventional manner. After the trench is formed with an initial cross section, the cross section is optionally increased by a conventional isotropic etch in the bottle etch process, extending the sides of the trench laterally past the sides in the upper portion. Buried plate 105 is formed by diffusion, e.g. gas phase diffusion or solid phase diffusion, into the substrate. Preferably, the diffusion extends such that adjacent buried plates make electrical contact in contemporary technology. A dielectric 107, e.g. oxynitride or other high-k dielectric materials, is formed by conventional thermal growth and/or deposition processes, followed by filling with conducting material(s) 110, e.g., doped polysilicon, to form the center electrode.

A trench collar 122 lines the section of the trench that separates the lower capacitor portion of the trench from the upper portion that will hold the vertical transistor. Dotted line 112 indicates the separation of the n-type substrate from the P-well that holds the vertical transistor.

Buried strap 125 is formed and lower electrode outdiffusion (or buried strap out diffusion) 127 is formed conventionally.

A separation insulator 130 referred to as the trench top oxide (TTO) is formed above the poly center electrode 110.

Formation of TTO 130 completes the processing of the lower portion of the cell. The trench in the lower portion does not change its shape after this step.

Above TTO 130, an aperture 112 having interior walls 115 remains to be processed according to the invention before formation of the vertical transistor.

FIG. 3C indicates the octagonal shape of the trench in this upper portion, with alternating {100} and {110} surfaces.

At the wafer surface, pad oxide 12 and pad nitride 14 are present, the trench in this region having interior walls 117 with the conventional oval shape, as shown in FIG. 3D.

Figure 4A:
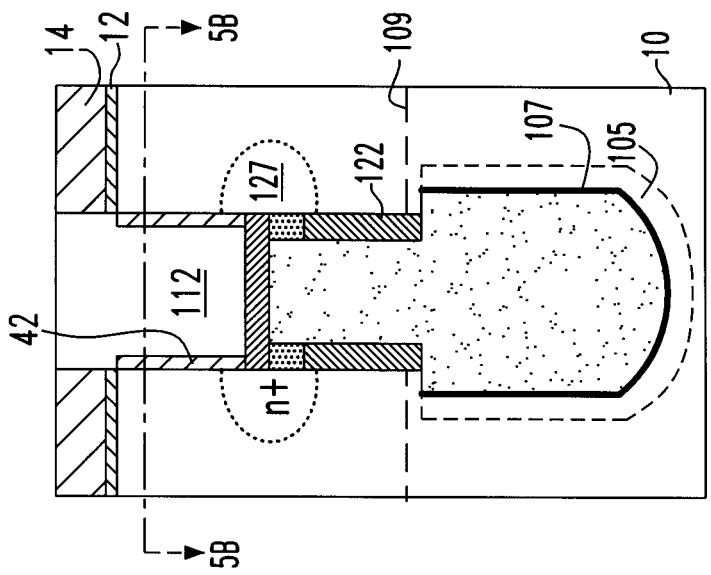
FIG. 4 shows the result of SiGe deposition.
Figure 4A:
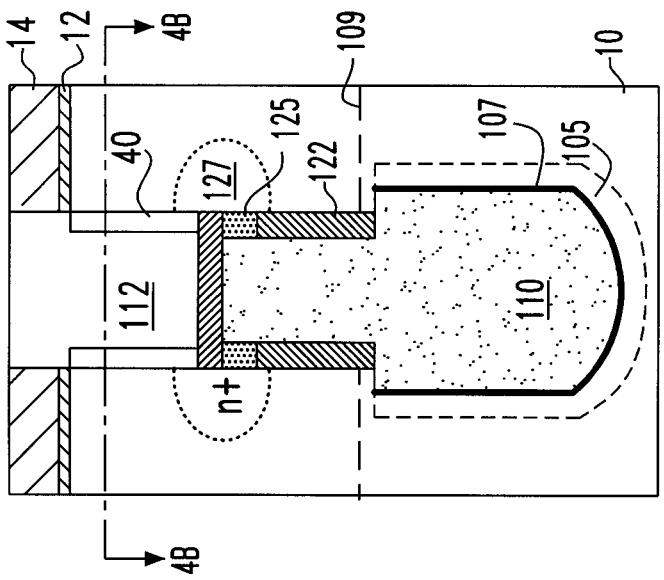
Figure 4B:
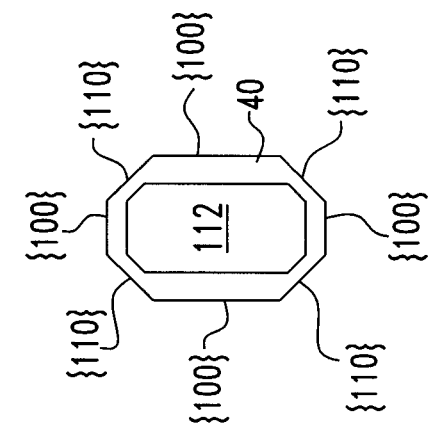

Next, according to the invention, an epitaxial liner layer of silicon germanium (SiGe, or $Si_{1-x}Ge_x$) 40 is formed on the interior walls 115 of the upper trench, as shown in FIGS. 4A and 4B. The material is referred to as the liner material, since it lines the aperture. The $Si_{1-x}Ge_x$ layer may be deposited or grown using conventional techniques such as chemical vapor deposition methods. For example, ultra-high vacuum chemical vapor deposition (UHVCVD) may be used in a conventional manner to grow a device quality $Si_{1-x}Ge_x$ layer. Other conventional techniques include rapid thermal chemical vapor deposition (RTCVD), low-pressure chemical vapor deposition (LPCVD), limited reaction processing CVD (LRPCVD) and molecular beam epitaxy (MBE). Optionally, a thin silicon buffer layer (not shown) may be formed on the interior walls 115 before $Si_{1-x}Ge_x$ formation. The value of x for the $Si_{1-x}Ge_x$ of the second layer may preferably range from 0.05 to 0.8, more preferably from 0.2 to 0.5, and most preferably about 0.35. Optionally, the $Si_{1-x}Ge_x$ film may be doped with carbon to form $Si_{1-x-y}Ge_xC_y$ film by adding a carbon species in the epitaxial process. Preferably, the value of y for the $Si_{1-x-y}Ge_xC_y$ is less than 0.02. More preferably, the value of y is about 0.005.

The thickness of $Si_{1-x}Ge_x$ is greater on the {100} surfaces than on the {110} surfaces. For example, for a thickness of 200 A (Angstroms) of $Si_{1-x}Ge_x$ on the {100} surface, the {110} surface will have a thickness of about 40 A.

Figure 5B:
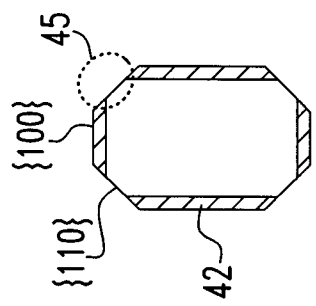
FIG. 5 shows the result of etching the SiGe layer.

$Si_{1-x}Ge_x$ 40 is stripped from the {110} surfaces in a conventional etch process, illustratively an ammonia-based chemistry that attacks the $Si_{1-x}Ge_x$ at a much greater rate than the silicon substrate. The difference in etch rate between $Si_{1-x}Ge_x$ and pure silicon is attributed to the change in energy band structure by the addition of germanium. A selectivity of 100:1 can be achieved with the ammonia-based chemistry when the value of x is 0.35. The result is shown in FIGS. 5A and 5B, with SiGe 42 on the {100} surfaces having a nominal thickness of 150A after the SiGe on the {110} surfaces has been removed. The condition on the thickness of the remaining SiGe 42 is that it is thick enough to survive the following etch in which the exposed silicon 15 on the {110} surfaces is etched selective to the SiGe by using a conventional selective etching process, such as a mixture of nitric and hydrofluoric acid.

Figure 6A:
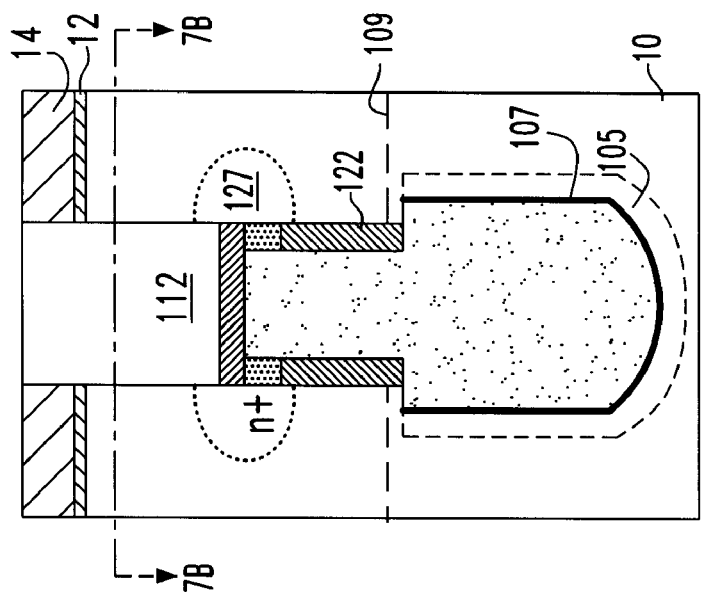
FIG. 6 shows the result of squaring the trench corners.
Figure 6B:
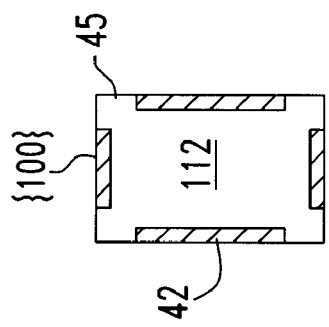

FIGS. 6A and 6B show the result of etching the silicon preferentially in corners 45.

Figure 7A:
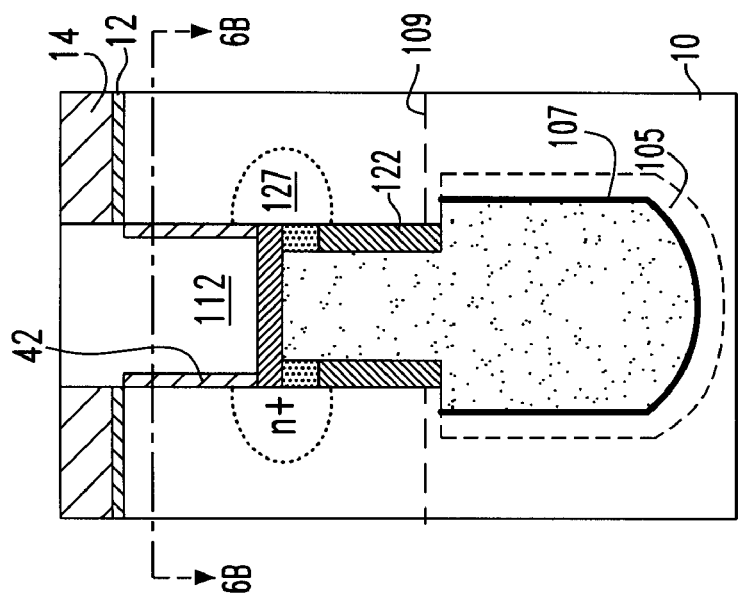
FIG. 7 shows the cell before forming the vertical transistor.
Figure 7B:
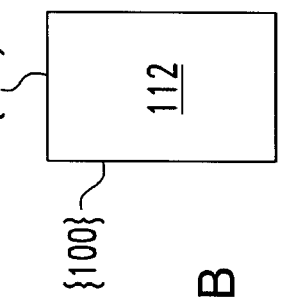

Any remaining SiGe 42 is stripped, illustratively in the same etch that removed the SiGe from the {110} surfaces. The result is shown in FIGS. 7A and 7B, with a rectangle that avoids the problem of corners in the active area. The length of the sides in FIG. 7B will be referred to as the wall width. As discussed with respect to FIG. 9, the active area overlaps the wall width and is placed between the corners. An alignment tolerance will be specified so the transistor does not overlap a corner.

FIG. 10B shows the improved alignment possible with cells made according to the invention. Misalignment of the AA strips 910 in the vertical direction in FIG. 10B will not affect the amount of overlap between the strip and the rectangles 142.

Referring back to FIG. 1, the DRAM cell is completed by forming the vertical transistor in the upper trench by forming gate dielectric 142 on the trench walls, filling the upper trench with gate conductor 140 to form the transistor gate and forming the upper transistor electrode 145. The gate dielectric 142 may include, but not limited to, oxide, nitride, $Al_2O_3$, $HfO_2$, HfSiO, $ZrO_2$, formed by conventional thermal growth and/or deposition processes. Preferably the gate dielectric 142 is an oxide layer with the thickness of 60 A formed by thermal growth. The gate conducting material 140 may include, but not limited to, doped polysilicon, metals, conducting nitride. Preferably the gate conductor 140 is arsenic-doped polysilicon formed by LPCVD process.

Insulator 32 (Array Top Oxide) replaces the pad oxide and pad nitride. Gate contact isolation 163 is formed within an aperture in insulation 32 and filled with poly gate contact 162.

Wordline 160, numeral 160 denoting both lower conducting layer 164 (e.g., tungsten or doped polysilicon) and insulating cap 165 (e.g., nitride and/or oxide) makes contact down through contact 162 to gate 140. Sidewalls 167 along with the insulating cap 165 (e.g. nitride and/or oxide), separate the gate contact from cell contact 147 which connects upper electrode 145 to a bitline not shown.

Bracket AA in FIG. 1C indicates where the AA region overlaps the trench, covering part of the wall width and offset from the corners by a tolerance distance. It is an advantageous feature of the invention that the side of the trench meeting the active area is straight, so that the transistor properties are not affected by misalignment.

PROCESS SUMMARY

The foregoing process may be summarized as:

Prepare a deep trench in a (100) silicon substrate oriented with axis parallel to the <100> directions on the surface, having sides at 45 degrees to the <100> directions at the bottom and having an octagonal cross section in the upper portion.

Form a capacitor in the deep trench, with collar and buried strap, up to the TTO.

Epitaxially grow SiGe on the exposed silicon walls of the upper trench—thicker on the {100} surfaces than on the {110} surfaces.

Etch the SiGe to expose the {110} Si surfaces.

Etch the exposed Si selective to SiGe, converting the octagonal shape to a rectangular shape.

Remove the remaining SiGe.

Form vertical transistor in the upper portion.

FIG. 2 shows the result of an alternative embodiment of the invention, in which the step of etching the exposed silicon is followed by a second epitaxial growth step of growing silicon in the upper trench.

This second epi step forms a silicon layer 155 in FIG. 2A that covers both the remaining SiGe 152 and the exposed silicon walls.

The result of this is that the layer 142 of gate dielectric is flat along the longer sides of the cross section in FIG. 2C, with a folded section 142' in each corner. The flat section is longer than the flat {100} surface in the prior art. Thus, this embodiment is also more resistant to misalignment than the prior art cells.

In addition to misalignment resistance, this embodiment has the advantage that the gate oxide formed on the Si epi 155 is of higher quality than the gate oxide that would be formed on the SiGe if the trench were formed with SiGe remaining.

Further, the remaining SiGe forms a channel for the vertical transistor that provides for the higher electron mobility of SiGe and therefore provides higher performance.

The location of the active area (AA) strip is indicated in FIGS. 1C and 2C by a bracket labeled AA, showing that the AA is well away from the corners 142'.

The method has been demonstrated including a vertical transistor in the context of a DRAM cell. The invention may be used to form vertical transistors in other circuits, in order to take advantage of a compact layout or for any other reason. The invention includes a general trench shaping method that changes an octagonal trench to a rectangular trench.

A summary of the process for a broader application is as follows.

Forming an octagonal trench in a (100) (silicon or similar) substrate with alternating {100} and {110} surfaces.

Epitaxially growing SiGe (or similar etch resistant material) on the exposed silicon walls of the upper trench—thicker on the {100} surfaces than on the {110} surfaces.

Etching the SiGe to expose the {110} Si surfaces.

Etching the exposed Si selective to SiGe, thereby converting the octagonal shape to a rectangular shape.

Optionally removing the remaining SiGe.

Those skilled in the art will appreciate that the starting material may also be another semiconductor material that has a suitable crystal structure with the appropriate difference in etch rates on the different crystal planes; e.g. Ge, SiGe, etc.

Further, a silicon-on-insulator (SOI) substrate may also be used as the starting material and the method illustrated is not confined to bulk wafers.

While the invention has been described in terms of a single preferred embodiment, those skilled in the art will recognize that the invention can be practiced in various versions within the spirit and scope of the following claims.

What is claimed is:

1. A method of forming a semiconductor device in a semiconductor substrate comprising the steps of:
    etching a trench having trench axes parallel to <100> directions of said substrate, said trench having a square cross section in a lower portion and an octagonal cross section in an upper portion;
    forming a liner layer of liner material on interior walls of said trench in said upper portion, whereby said liner layer has a first thickness on {100} surfaces of said interior walls;
    etching said liner layer selective to the substrate, whereby said liner layer remains on said {100} surfaces and corners of said trench are exposed;
    etching said interior walls selective to said liner layer, whereby said octagonal cross section is converted to a rectangular cross section having a trench wall width between trench corners.

2. A method according to claim 1, in which said substrate is silicon and said liner material is selected from the group comprising $Si_{1-x}Ge_x$ and $Si_{1-x-y}Ge_xC_y$, further comprising a step of:

stripping said liner material from said interior walls after said step of etching said interior walls selective to said liner material.

3. A method according to claim 2, further comprising a step of forming a vertical transistor having an active area overlapping said trench wall width and offset from said trench corners.

4. A method according to claim 3, in which said first thickness is reduced to a second thickness after said step of etching said liner material selective to the substrate, said second thickness being such that remaining liner material protects {100} surfaces of said interior walls during said step of etching said interior walls selective to said liner material.

5. A method according to claim 4, in which said step of etching said interior walls selective to said liner material is performed with an etchant including a compound from the group consisting of ammonia, tetramethyl ammonium hydroxide and a mixture of nitric and hydrofluoric acid.

6. A method according to claim 2, in which said first thickness is reduced to a second thickness after said step of etching said liner material selective to the substrate, said second thickness being such that remaining liner material protects {100} surfaces of said interior walls during said step of etching said interior walls selective to said liner material.

7. A method according to claim 3, in which said step of etching said interior walls selective to said liner material is performed with an etchant including a compound from the group consisting of ammonia, tetramethyl ammonium hydroxide and a mixture of nitric and hydrofluoric acid.

8. A method according to claim 2, in which said step of depositing a liner material is performed with UHVCVD.

9. A method according to claim 1, in which said substrate is silicon and said liner material is selected from the group comprising $Si_{1-x}Ge_x$ and $Si_{1-x-y}Ge_xC_y$; and further comprising a step of:

epitaxially growing silicon on said interior walls and on said liner material after said step of etching said interior walls selective to said liner material.

10. A method according to claim 3, in which said substrate is silicon and said liner material is selected from the group comprising $Si_{1-x}Ge_x$ and $Si_{1-x-y}Ge_xC_y$; and further comprising a step of:

epitaxially growing silicon on said interior walls and on said liner material after said step of etching said interior walls selective to said liner material.

11. A method according to claim 10, in which said first thickness is reduced to a second thickness after said step of etching said liner material selective to the substrate, said second thickness being such that remaining liner material protects {100} surfaces of said interior walls during said step of etching said interior walls selective to liner material.

* * * * *